United States Patent [19]

Park

[11] Patent Number: 5,051,624
[45] Date of Patent: Sep. 24, 1991

[54] HIGH SPEED LEVEL CONVERTER TO CONVERT A TTL LOGIC SIGNAL TO A CMOS LOGIC SIGNAL

[75] Inventor: Yong-Bo Park, Busan, Rep. of Korea

[73] Assignee: Samsung Electronics Co., Ltd., Suweon, Rep. of Korea

[21] Appl. No.: 484,120

[22] Filed: Feb. 22, 1990

[30] Foreign Application Priority Data

Oct. 26, 1989 [KR] Rep. of Korea .............. 89-15443[U]

[51] Int. Cl.[5] ............................................... H03K 5/12
[52] U.S. Cl. .................... 307/475; 307/448; 307/443; 307/264
[58] Field of Search ............... 307/475, 445, 448, 264, 307/443, 246, 594, 601

[56] References Cited

U.S. PATENT DOCUMENTS

| | | | |
|---|---|---|---|
| 4,450,371 | 5/1984 | Bismark | 307/475 |
| 4,728,820 | 3/1988 | Lee | 307/601 |
| 4,763,022 | 8/1988 | Sheldon | 307/264 |
| 4,794,282 | 12/1988 | Colles | 307/264 |

Primary Examiner—David Hudspeth
Assistant Examiner—Scott A. Ouellette
Attorney, Agent, or Firm—Ladas & Parry

[57] ABSTRACT

A level converter for converting a TTL level of an input signal to a CMOS level comprises a NOR gate circuit (1), including a first voltage pull-up PMOS transistor (PI2), to which the TTL signal is inputted, an inverter (INV) connected to the NOR gate circuit, and a speed control circuit (2). The speed control circuit includes a second voltage pull-up PMOS transistor (PI4), and means are provided for connecting the first and second transistors in parallel between VCC and the input to the inverter. A fast conversion speed is obtained by turning on both PMOS transistors (PI2, PI4) when the TTL signal goes from the high level to the low level.

5 Claims, 2 Drawing Sheets

HIGH SPEED LEVEL CONVERTER TO CONVERT A TTL LOGIC SIGNAL TO A CMOS LOGIC SIGNAL

BACKGROUND OF THE INVENTION

The present invention relates to semiconductor chips, particularly to a high speed level converter to convert a TTL level of an input signal to a CMOS level.

Generally, the level of a TTL signal is defined as a logic low level if it is between 0 V and 0.8 V, while the level is defined as a logic high level if it is between 2.2 V and 5 V. On the other hand, the level of CMOS signal is defined as a logic low level if it is at the VSS level (0 V), while it is defined as the logic high level if it is at the VCC level (5 V). Thus, when the TTL signal is applied as an input signal to CMOS semiconductor chips, a level converter is needed to convert the TTL signal level to the CMOS signal level. A conventional level converter comprising a NOR gate, as shown in FIG. 1, converts the TTL signal level to the CMOS signal level by a voltage pull-up or pull-down operation.

But, if the input level of the TTL signal is 2.2 V, the PMOS pull-up transistor PI2 and the NMOS pull-down transistor NI2 are turned on at the same time, so that the PMOS transistor PI2 must be smaller than that of the NMOS transistor NI2 in order to pull down the output to the low-level, e.g., a zero level. Thus, the converting speed of the NOR gate 1 becomes slow when the TTL signal changes from the high level to the low level since the PMOS transistor PI2 is relatively smaller than the NMOS transistor NI2. This becomes an obstacle to high-speed operation.

SUMMARY OF THE INVENTION

It is an object of the present invention to provide a level converter to achieve a high-speed operation in a level conversion from a TTL signal level to a CMOS signal level.

It is another object of the present invention to provide a level converter having a speed control circuit for enhancing the conversion speed of the converter. These and other objects are achieved in a level converter which has a speed control circuit between an input terminal for a TTL signal and an inverter connected to an output terminal.

According to the present invention, a level converter is provided which includes a NOR gate consisting of PMOS and NMOS transistors controlled by a control signal and PMOS and NMOS transistors receiving a TTL signal, an inverter connected to an output terminal of the NOR gate, a coupling part controlled by the TTL input signal, a constant voltage part to establish a constant voltage to an output terminal of the coupling part, and a speed control part controlled by the charging or discharging of the voltage of the coupling part and the constant voltage of the constant voltage part.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

The present invention will be now described in more detail with reference to accompanying drawings.

Figure 1:
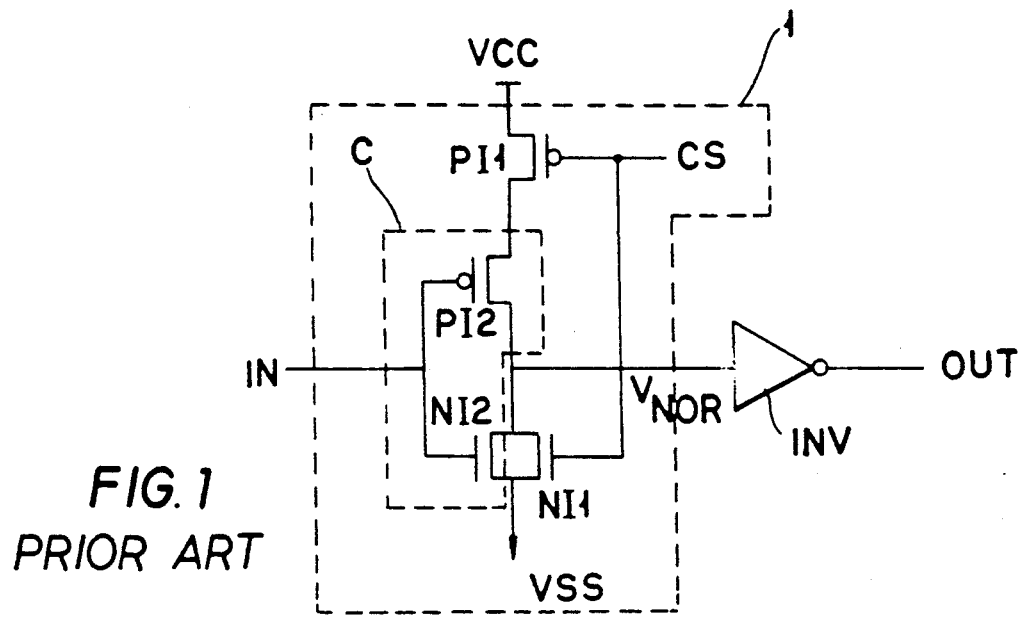
FIG. 1 is a detailed circuit diagram of a conventional level converter.

FIG. 1 shows a conventional level converter, where a control signal CS to control the level converter is applied to both gates of PMOS and NMOS transistors PI1 and NI1. Also, a CMOS transistor pair C consisting of a PMOS pull-up transistor PI2 and a NMOS pull-down transistor NI2 is connected between a drain of the PMOS transistor PI1 and ground (VSS) and is operated by a TTL signal having 0.8 V and 2.2 V as logic low and high levels, respectively. An inverter INV is connected to an output terminal of the CMOS transistor pair C in order to invert the pulled-up or pulled-down signal. The PMOS transistors PI1, PI2, and NMOS transistors NI1, NI2 comprise a NOR gate.

In such a configuration, if a control signal CS of high level is applied to both gates of the PMOS and NMOS transistors PI1 and NI1, the level converter is not active. But, if the control signal CS is at a low level, the level converter is enabled so that the TTL signal level is converted to a CMOS signal level. That is, if the TTL signal is at a low level, the PMOS transistor PI2 of the CMOS transistor pair C is turned on much more strongly than is the NMOS transistor NI2 because the threshold voltage of the NMOS transistor is about 0.8 V and that of the PMOS transistor is about −0.8 V, respectively. Thus, the output of the NOR gate 1 is pulled up to provide the high level of 5 V. This high level voltage provided from the NOR gate 1 is inverted to the low level by the inverter INV.

On the other hand, if the TTL signal is at the high level of 2.2 V, the PMOS transistor PI2 and the NMOS transistor NI2 are turned on at the same time. Thus, in order to keep the output level at the low level, the PMOS transistor PI2 must be smaller than the NMOS transistor NI2.

That is, the NMOS transistor NI2 is turned on more strongly than the PMOS transistor PI2, so that the output voltage VNOR of the NOR gate 1 is pulled down. Thus, the output signal of the NOR gate 1 becomes the low level and the output signal is inverted to the high level by the inverter INV. But, the PMOS transistor PI2, of smaller size than the NMOS transistor NI2, makes the conversion speed slow when the input signal is changed from the high level to the low level.

Figure 2:
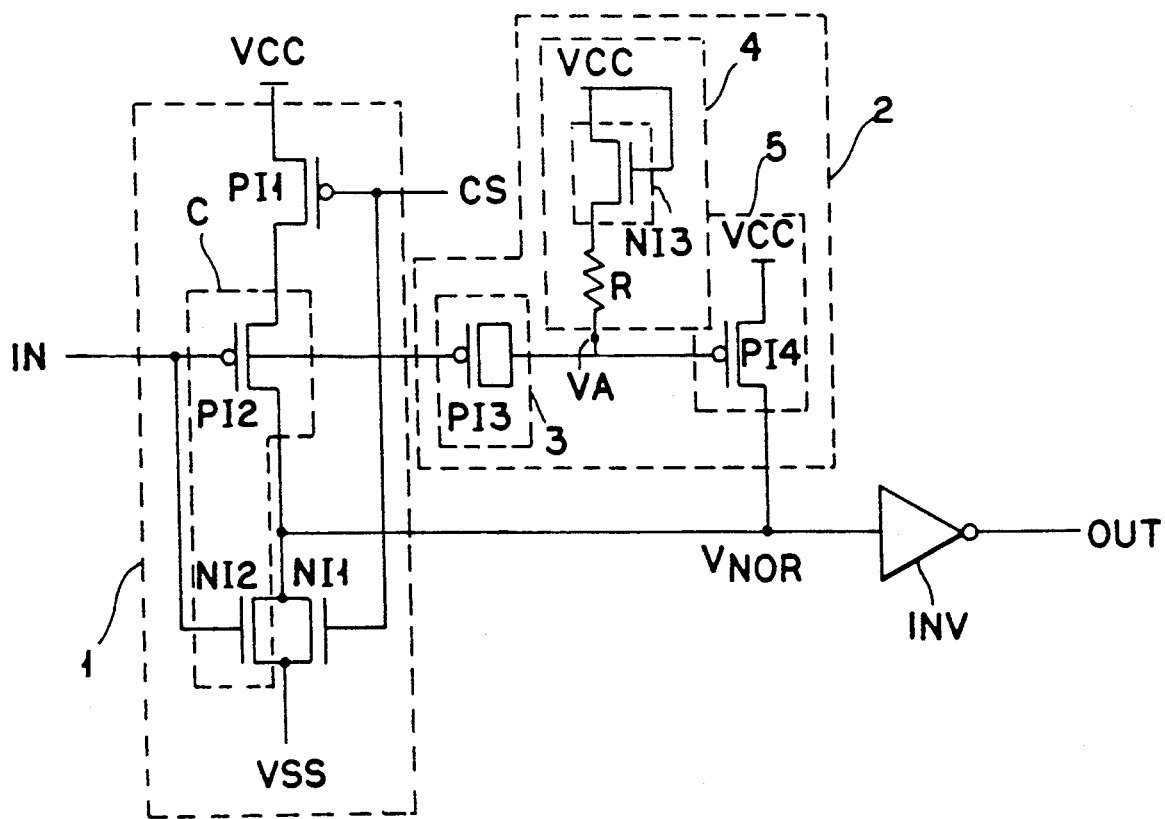
FIG. 2 is a detailed circuit diagram of a level converter of the present invention.

FIG. 2 is a detailed circuit diagram of a level converter according to the present invention. A control signal CS to control the level converter is applied to both gates of PMOS and NMOS transistors PI1 and NI1 in FIG. 2. Also, a CMOS transistor pair C consisting of a PMOS pull-up transistor PI2 and a NMOS pull-down transistor NI2 is connected between a drain of the PMOS transistor PI1 and the ground (VSS) and is operated by a TTL signal having 0.8 V and 2.2 V as low and high levels, respectively. A NOR gate 1 includes the PMOS transistors PI1, PI2 and the NMOS transistors NI1 and NI2. In addition, the TTL signal is applied to a coupling part 3 consisting of a PMOS transistor PI3 for coupling with the TTL input signal. Also, the source and drain of the PMOS transistor P3 are connected together to form a capacitor.

Next, a constant voltage part 4 to provide a constant voltage is connected to the PMOS transistor PI3. The constant voltage part 4 consists of a NMOS transistor NI3, which is always turned on since the supply voltage VCC is applied to both its gate and drain for diode operation, and a high-valued resistor R connected to a source of the NMOS transistor NI3. The resistor R is made of poly-silicon or a very small PMOS transistor of which a gate is connected to the ground, VSS.

The common source and drain node of the PMOS transistor PI3 in the coupling part 3 is connected to the resistor R in the constant voltage part 4. In addition, a speed control part 5 is provided consisting of a PMOS transistor PI4 which is turned on or off by an input signal from the PMOS transistor. In other words, a gate of the PMOS transistor PI4 in the speed control part 5 is connected to the output terminal of the constant voltage part 4, while the drain of the transistor PI4 is connected to the output terminal of the CMOS transistor pair C. The coupling part 3, the constant voltage part 4, and the speed control part 5 comprise a speed control circuit 2.

The operation of the present invention will be now described in detail.

When the control signal CS is at a high level, the PMOS transistor PI1 is turned off so that the level converter is disabled.

But if the control signal CS is at a low level, the level converter is enabled. First, if the level converter is enabled and the TTL signal is in the low level state, the output of the NOR gate 1 provides a high level signal, and the high level signal from the NOR gate 1 is inverted to a low level signal by the inverter INV. Next, when the TTL signal is switched to the high level state, both PMOS and NMOS transistors PI2 and NI2 are turned on at the same time. But, the PMOS transistor PI2 is smaller than the NMOS transistor NI2 (as in the prior art converter of FIG. 1), so that the NMOS transistor NI2 is more strongly turned on than the PMOS transistor PI2. Thus, the TTL signal is pulled down by the NMOS transistor NI2 to provide the low level signal, and the low level signal is inverted to the high level signal by the inverter INV.

When the TTL signal is changed from the low level to the high level, both PMOS and NMOS transistors PI2 and NI2 are turned on, and the output of the NOR gate 1 is pulled-down to the low level state since the NMOS transistor NI2 is larger than the PMOS transistor PI2. Also, the TTL input signal is applied to the gate of the PMOS transistor PI3 in the coupling part 3. The reference output voltage VA from the constant voltage part 4 is determined by the difference between the supply voltage VCC and the threshold voltage VT of the NMOS transistor NI3 and the back bias voltage VBB; that is, $VA = VCC - VT - VBB$. Thus, the PMOS transistor PI4 is turned off. But, if the input voltage goes from the high level to the low level, the NMOS transistor NI2 in the NOR gate 1 is turned off, while the PMOS transistor PI2 is turned on Thus, the output voltage VNOR from the NOR gate 1 is pulled-up to the high level state, but the conversion speed would be slow due to the relatively small size of the PMOS transistor PI2.

However, the PMOS transistor PI3 in the coupling part 3 is also coupled to the input signal, so that the reference voltage VA becomes sufficiently low to turn on the PMOS transistor PI4 in the speed control part 5. That is, the voltage VA applied to the gate of the PMOS transistor PI4 is reduced to a level below the normal reference level VA of the constant voltage part 4. Thus, when the TTL voltage goes from the high level to the low level, the PMOS transistor PI2 in the CMOS transistor pair C and the PMOS transistor PI4 in the speed control part 5 are turned on at the same time, thereby speeding up the rise of the output voltage VNOR of the NOR gate 1. Thus, the output voltage OUT from the inverter INV is more quickly switched to the low level state.

Also, after a constant time, the reference voltage VA from the constant voltage part 4 is recovered, so that the transistor PI4 is again turned off, but not before the output voltage from the NOR gate 1 has reached the high level state. As mentioned above, in the conversion from the TTL level to the CMOS level, the conversion speed is very slow since the PMOS transistor PI2 is smaller than the NMOS transistor NI2 to provide the low level signal in the NOR gate 1 when the TTL input signal goes from the high level to the low level.

But, the present invention makes the conversion speed fast by turning on both the PMOS transistor PI2 of the CMOS transistor pair in the NOR gate and the PMOS transistor PI4 in the speed control part 5 when the TTL signal goes from the high level to the low level. Also, the speed control circuit, consisting of the coupling part, the constant voltage part, and the speed control part, is simple, so that it can be easily added to a conventional level converter.

Figure 3:
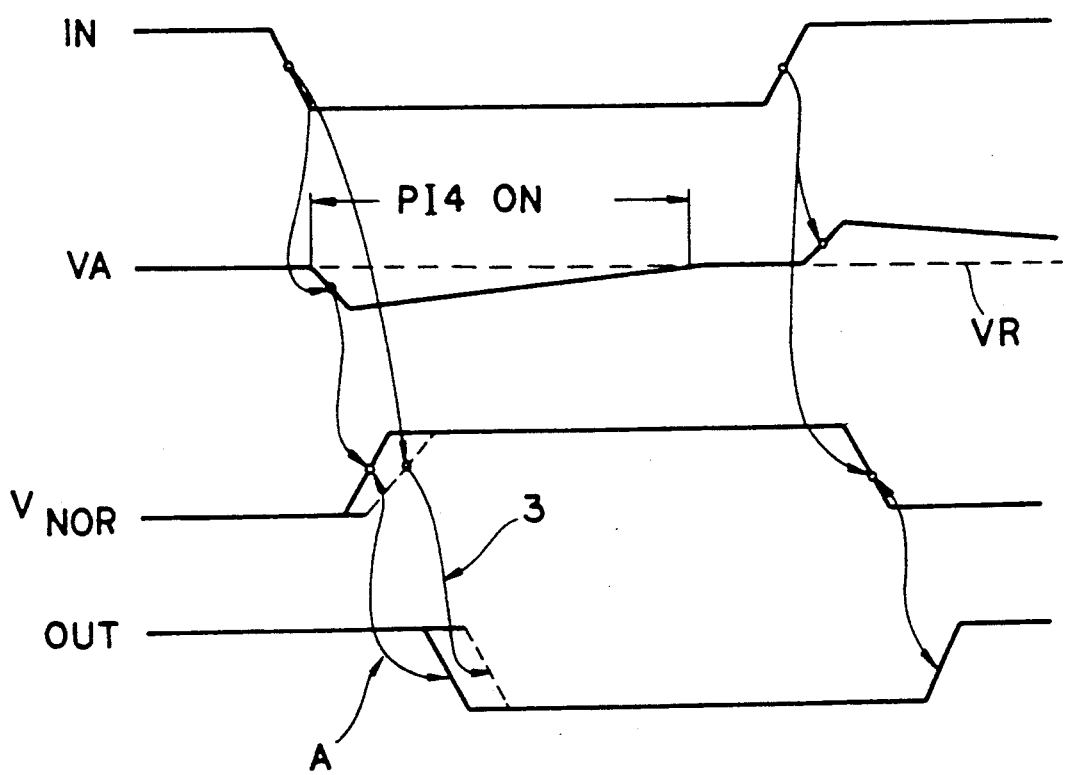
FIG. 3 is a timing diagram for a comparison between the conventional level converter and a level converter according to the present invention.

The timing of the various voltages referred to in the foregoing description is shown in FIG. 3 which shows, in solid lines, the timing obtained in the circuit of FIG. 2 versus the timing, shown in dashed lines, obtained with the prior art circuit of FIG. 1.

Thus, when the IN (TTL input) signal first decreases from the high level to the low level, the voltage drop is coupled across the transistor PI3, functioning as a capacitor, to reduce the voltage VA. This reduced voltage VA turns on transistor PI4 which couples VCC to VNOR, i.e., pulling-up the voltage at VNOR. The pull-up of VNOR occurs sooner than in the FIG. 1 circuit because transistor PI4 turns on faster than transistor PI2, and the pull-up occurs at a faster rate because both transistors PI2 and PI4 are performing the pull-up function.

In the following "steady state" condition, i.e., during the interval before the next transition of the level of the IN signal, the voltage VA is recharged to its original or "steady state" level (VCC) by the constant voltage part 4. This turns off transistor PI4.

When the IN signal thereafter rises to the high level, this voltage increase also causes a voltage rise (across the capacitor-transistor PI3) in VA. This voltage rise, however, has no effect on the circuit because transistor PI4 is already off, and remains off. The voltage at the VNOR is thus controlled by the operation of the pull-down transistor NI2, and the pull-down of VNOR occurs as in the FIG. 1 circuit. Before the next transition of the level of the IN signal, the voltage VA discharges to its steady state level.

The invention is in no way limited to the embodiment described hereinabove. Various modifications of the disclosed embodiment as well as other embodiments of the invention will become apparent to persons skilled in the art upon reference to the description of the invention. It is therefore contemplated that the appended claims will cover any such modifications or embodiments as fall within the true scope of the invention.

I claim:

1. A level converter comprising:

NOR gate means including a PMOS transistor (PI1) and a NMOS transistor (NI1) both of which are controlled by a control signal (CS), and a CMOS transistor pair (PI2, NI2) to the gates of which are provided a TTL signal;

inverter means connected to said NOR gate means for inverting an output signal from said NOR gate means; and speed control means including a coupling part (3) for coupling with the TTL signal, said coupling part having an output node, a constant voltage part (4) for establishing a reference voltage (VA) and coupling it to said output node, and a speed control part (5) connected in parallel with said NOR gate means to said inverter means and responsive to the voltage at said output node for controlling a conversion speed of the converter.

2. A level converter according to claim 1, wherein said coupling part includes a PMOS transistor (PI3) of which a gate is provided with the TTL signal and a source and drain are connected together.

3. A level converter according to claim 1, wherein said constant voltage part (4) includes a NMOS transistor (NI3) of which a drain and gate are connected to a VCC terminal of a voltage supply and a source is connected to a resistor (R).

4. A level converter according to claim 1, wherein said speed control part (5) includes a PMOS transistor (P14) which is turned on or off by the voltage at said output node.

5. A level converter according to claim 3, wherein said resistor (R) is made of one of poly-silicon or a PMOS transistor of which a gate is connected to a ground terminal of said voltage supply.

* * * * *